(12) United States Patent
Nading et al.

(10) Patent No.: US 6,369,800 B1
(45) Date of Patent: Apr. 9, 2002

(54) METHOD AND APPARATUS FOR USE WITH A KEYPAD OF AN ELECTRONIC DEVICE

(75) Inventors: Fred Nading, Cary; Phillip Kidd, Apex, both of NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/054,639

(22) Filed: Apr. 3, 1998

(51) Int. Cl.[7] .................................................. G09G 5/00
(52) U.S. Cl. ........................ 345/168; 345/170; 341/31; 200/314
(58) Field of Search ................................. 345/156, 168, 345/169, 170, 171, 172, 102; 341/22, 31, 23; 200/313, 314

(56) References Cited

U.S. PATENT DOCUMENTS

| | | | |
|---|---|---|---|
| 3,934,248 A | * 1/1976 | Mueller | 345/170 |
| 4,294,517 A | 10/1981 | Jakubek | 350/345 |
| 4,551,717 A | * 11/1985 | Dreher | 345/170 |
| 4,630,895 A | 12/1986 | Abdala, Jr. et al. | 350/345 |
| 4,641,026 A | * 2/1987 | Garcia, Jr. | 250/229 |
| 5,034,602 A | * 7/1991 | Garcia, Jr. et al. | 345/170 |

\* cited by examiner

*Primary Examiner*—Dennis-Doon Chow
(74) *Attorney, Agent, or Firm*—Coats & Bennett, P.L.L.C.

(57) ABSTRACT

A method and apparatus for use with a keypad for an electronic device including at least one plunger associated with a key, wherein the plunger is moveable between a first position and a second position relative to the electronic device. The apparatus is an electrical assembly including a light guide, and at least one electrical component carried by the light guide and positioned to underlie the key for at least one of a) illuminating the key, and b) changing between a first electrical state and a second electrical state in response to the plunger being moved between the first and second positions to indicate that the key has been operated by a user.

17 Claims, 8 Drawing Sheets

METHOD AND APPARATUS FOR USE WITH A KEYPAD OF AN ELECTRONIC DEVICE

FIELD OF THE INVENTION

This invention relates to electronic devices, and more particularly, to illuminating a keypad of an electronic device and detecting operation of a key on the keypad by the user of the electronic device.

BACKGROUND OF THE INVENTION

It is known to mount light-emitting diodes ("LEDs") and switches directly on a main printed circuitboard ("PCB") or a dedicated PCB for use with the keypad of an electronic device. Light from the LEDs is diffused by a translucent light guide overlaying the LEDs, thereby illuminating the keypad.

One problem associated with the above-described construction is that it may complicate the design of complex PCBs, which must meet continuing demands for increased circuit density and reduction in the overall product size/volume for electronic devices. More specifically, keypads and their supporting components, such as LEDs and switches, tend to take a large amount of PCB area for implementation, thereby reducing the area available for other circuits and/or components on the PCB. Furthermore, to accommodate other electronic components and circuits in the keypad area overlying the PCB, holes may have to be cut in the light guide and/or the locations of the LEDs may have to be compromised, thereby potentially reducing the quality of keypad illumination (i.e., low light levels and uneven illumination).

SUMMARY OF THE INVENTION

In accordance with the present invention, an electrical assembly is provided for use with a keypad for an electronic device including at least one plunger associated with a key, the plunger being moveable between a first position and a second position relative to the electrical assembly in response to operation of the key by a user.

In one form, the electrical assembly includes a light guide, and at least one electrical component carried by the light guide and positioned to underlie the key for at least one of a) illuminating the key, and b) changing between a first electrical state and a second electrical state in response to the plunger moving between the first and second positions to indicate that the key has been operated by a user.

In one form, the light guide has a first surface defining a keysite positioned to underlie the key, and the at least one electrical component includes at least one light source carried in the light guide underlying the keysite to direct light through the keysite to illuminate the key.

In one form, the at least one electrical component includes an open electrical circuit defined by a conductive grid. The circuit is closed by contact with a conductor grid on the plunger with the plunger in one of the first and second positions.

In one form, the light guide has a first surface defining a keysite positioned to underlie the key, the conductive grid is mounted on the first surface at the keysite, and the at least one electrical component further includes at least one light source carried in the light guide beneath the keysite to direct light through the keysite and the conductive grid to illuminate the key.

In one form, the electrical assembly further includes a bus carried by the light guide for electrically connecting the circuit and the light source to at least one other component of the electronic device.

In one form, the electrical component is embedded in the light guide.

In one form, the electrical assembly includes a light guide, and a switch carried by the light guide. The switch is configured to change between a first electrical state and a second electrical state in response to the plunger moving between the first and second position to indicate that the key has been operated by a user.

In one form, the electrical assembly further includes a light source carried by the light guide for illuminating at least a portion of the key pad.

In one form, the electrical assembly further includes a bus carried by the light guide for electrically connecting the switch and the light source to at least one other component of the electronic device.

In one form, the switch is embedded in the light guide.

In one form, the switch includes a light source and an optical detector. The light source and the optical detector are positioned by the light guide so that movement of the plunger between the first and second positions interrupts a light signal transmitted to the optical detector from the light source.

In one form, the switch includes a light source and an optical detector. The light source and the optical detector are located in the light guide so that movement of the plunger between the first and second positions causes a light signal from the light source to be directed to the optical detector.

In one form, the switch includes a magnetic switch that is responsive to a changing magnetic field produced by movement of the plunger between the first and second positions.

In one form, the switch includes a conductive grid on the light guide that is contacted by a conductor on the plunger with the plunger in one of the first and second positions.

In accordance with one aspect of the invention, a method is provided for illuminating a keypad of an electronic device and detecting operation of a key on the keypad by a user. The method includes the steps of generating light in the electronic device, transmitting the light to the keypad through a light guide to illuminate at least part of the keypad, and generating a changed electrical state for the electronic device from a location in the light guide in response to operation of the key by a user.

In one form, the step of generating a changed electrical state includes the step of altering a light signal in the light guide to change the electrical state for the electronic device.

In one form, the step of generating a changed electrical state includes the step of altering an electromagnetic field in the light guide to change the electrical state for the electronic device.

In one form, the step of generating light in the electronic device includes the step of generating the light from a location in the light guide.

In one form, the step of transmitting light includes the step of transmitting the light from a location in the light guide to the at least part of the keypad.

In accordance with one aspect of the invention, a method is provided for illuminating a key on a keypad of an electronic device. The method includes the steps of generating light in the electronic device, and transmitting the light to the key through a light guide from a location in the light guide underlying the key to illuminate the key.

DETAILED DESCRIPTION OF THE PREFERRED EMBODIMENTS

Figure 1:
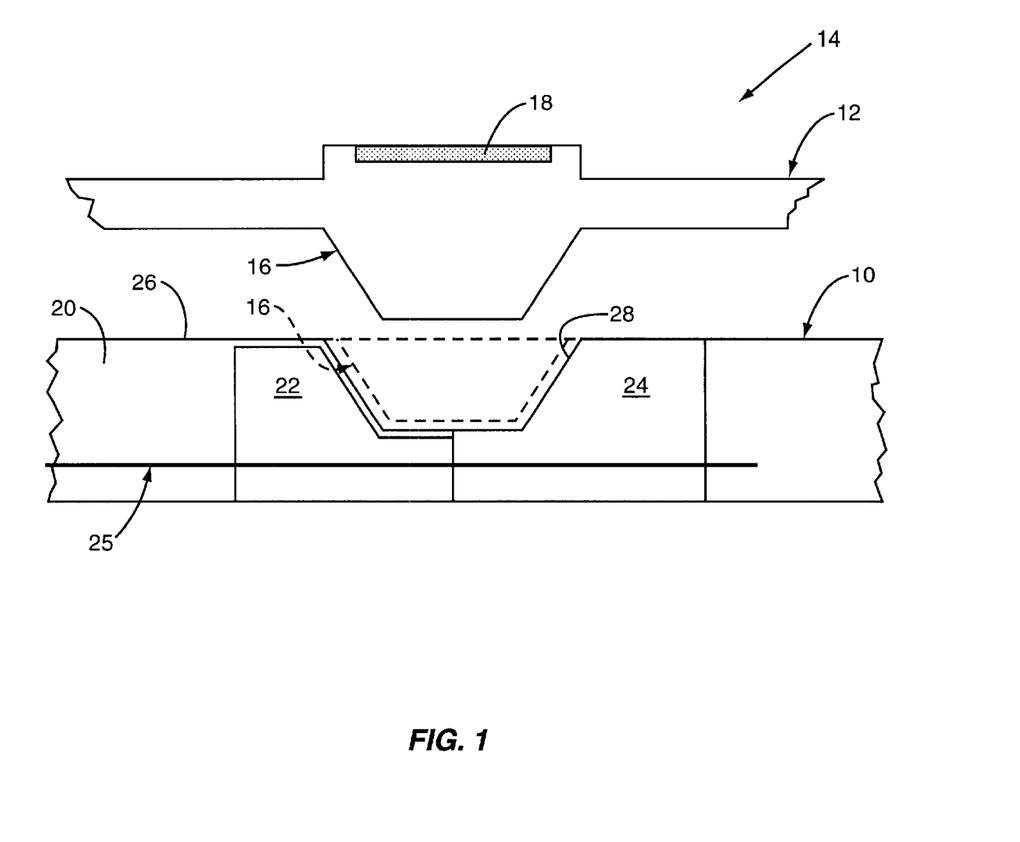
FIG. 1 is a diagrammatic view of an electrical assembly embodying the invention.

As seen in FIG. 1, the invention is embodied in an electrical assembly 10 for use with a keypad 12 of an electronic device 14. The keypad 12 includes at least one plunger 16 associated with a key 18. The plunger 16 is moveable between a first position (shown in solid lines) and a second position (shown in phantom lines) relative to the electrical assembly 10 in response to operation of the key 18 by a user of the electronic device 14.

The electrical assembly 10 includes a light guide 20 made of translucent/optical material, a light source 22 carried in the light guide 20 for illuminating the key 18, and a switch 24 carried by the light guide 20 and configured to change between a first electrical state and a second electrical state in response to the plunger 16 moving between the first and second positions to indicate that the key 18 has been operated by a user of the electronic device 14. The electrical assembly 10 further includes an electrical bus 25 for connecting the light source 22 and the switch 24 to another component(s) of the electronic device 14. The light guide 20 has a first surface 26 that defines a keysite 28 positioned to underlie the key 18 and the plunger 16.

Figure 2:
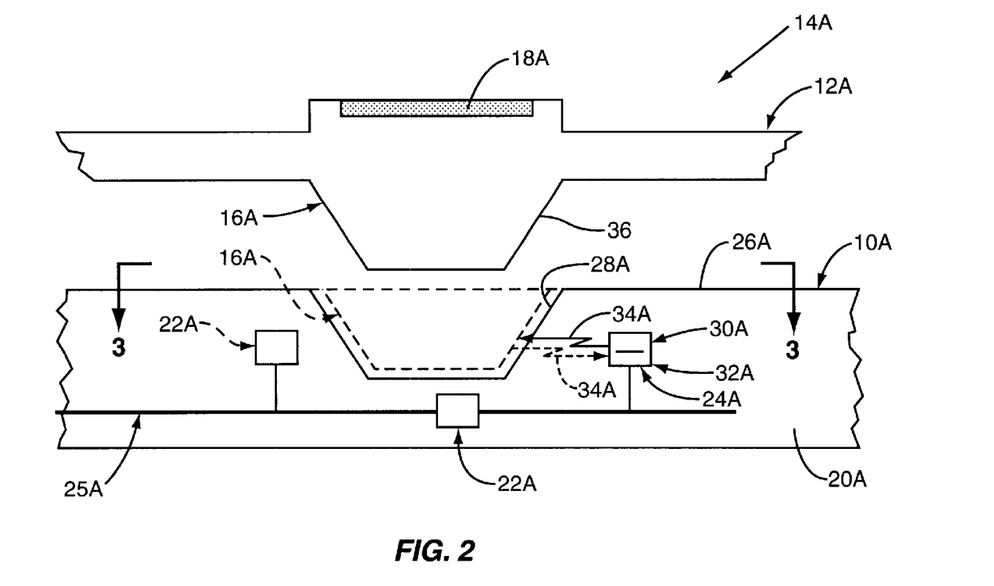
FIG. 2 is a diagrammatic view of another electrical assembly embodying the present invention.
Figure 3:
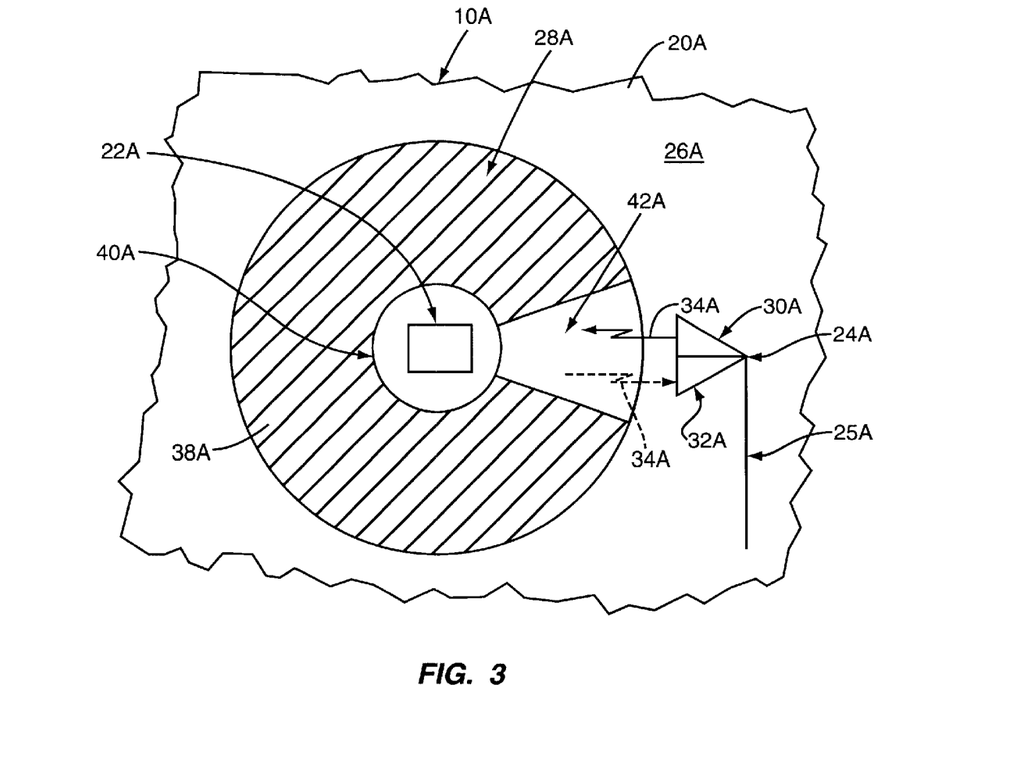
FIG. 3 is a plan view taken along line 3—3 in FIG. 2.

FIGS. 2 and 3 show one embodiment of an electrical assembly 10A wherein a switch 24A includes a light source 30A and an optical detector 32A, both of which are embedded in a light guide 20A to one side of a keysite 28A. The light source 30A is positioned to direct a light signal 34A into the keysite 28A so that movement of the plunger 16A to a second position (shown in phantom) causes the light signal 34A to be directed to the optical detector 32A, which then changes between the first and second electrical states in response to the light signal 34A to indicate that the key 18A has been operated by a user. In this regard, it is preferred that the plunger 16A include a light reflective material or coating 36 positioned on the plunger 16A to direct the light signal 34A from the light source 30A to the optical detector 32A when the plunger 16 is moved to the second position, as shown in phantom. A light source 22A is preferably embedded in the light guide 20A underlying the keysite 28A to direct light through the keysite 28A and a plunger 16A to illuminate a key 18A. Alternatively, the light source 22A may be carried by the light guide 20A in a position that does not underlie the keysite 28A as shown, for example, in phantom. As another alternative, illumination of the key 18 may be provided by the light source 30A, thereby eliminating the need for a separate light source 22A.

As shown by the shaded area in FIG. 3, a light reflective material or coating 38A is preferably provided on selected portions of the surface 26A at the keysite 28A to enhance the illumination of the key 18A by the light source 22A. Optically translucent areas 40A and 42A are maintained on the surface 26A to allow light from the light sources 22A, 30A to enter the keysite 28A.

Figure 4:
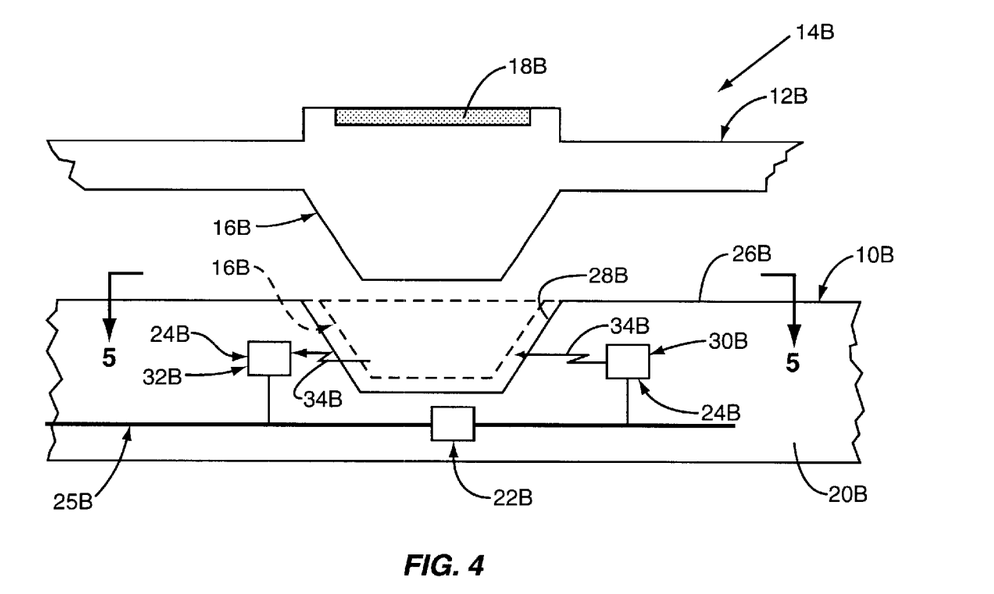
FIG. 4 is a diagrammatic view of another electrical assembly embodying the invention.
Figure 5:
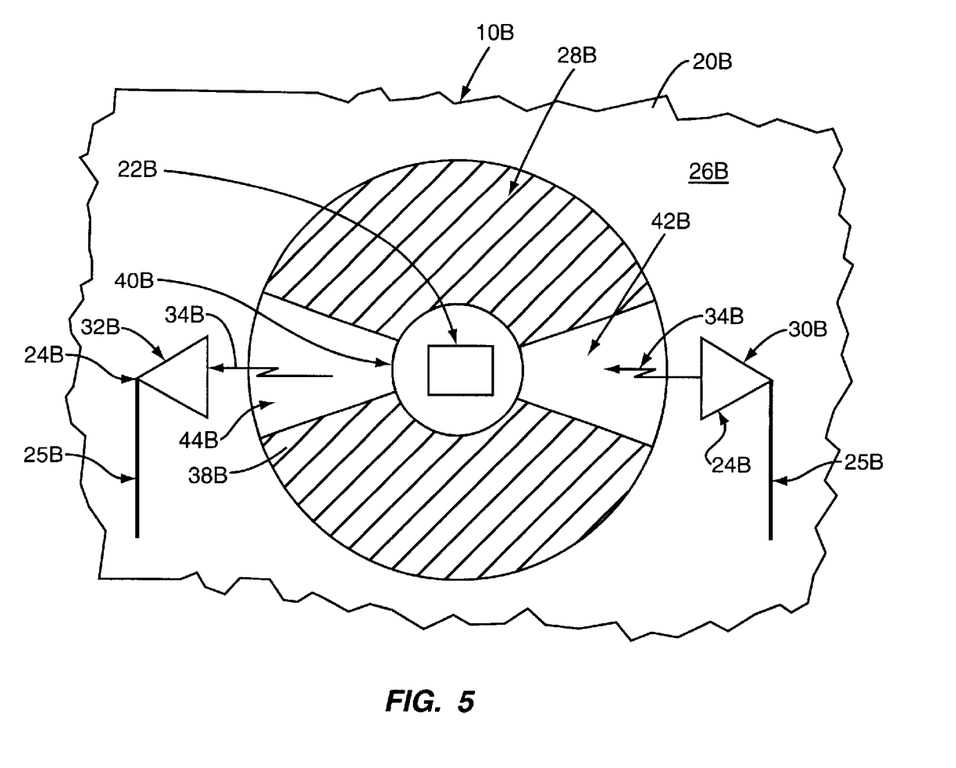
FIG. 5 is a plan view taken along line 5—5 in FIG. 4.

FIGS. 4 and 5 show an embodiment of an electrical assembly 10B wherein a switch 24B includes a light source 30B and an optical detector 32B that are embedded in a light guide 20B on opposite sides of a keysite 28B so that the light source 30B directs a light signal 34B through the keysite 28B to the optical detector 32B with a plunger 16B in a first position. Movement of the plunger 16B to a second position (shown in phantom) interrupts the light signal 34B to the optical detector 32B which changes between first and second electrical states in response to the interruption to indicate that a key 18B has been operated by a user. Again, as with the embodiments shown in FIGS. 2 and 3, a light source 22B is preferably embedded in the light guide 20B in a position underlying the key 18B to direct light through the keysite 28B and the plunger 16B to illuminate the key 18B. However, as with the embodiment shown in FIGS. 2 and 3, the light source 22B may be carried by the light guide 20B at a location that does not underlie the keysite 28B, or the light source 30B may provide illumination of the key 18B.

As seen in FIG. 5, if a light reflective material or coating 38B is provided at the keysite 28B, an additional optically translucent area 44B must also be provided at the keysite 28B so that the light signal 34B can be transmitted from the light source 30B to the optical detector 32B.

Figure 6:
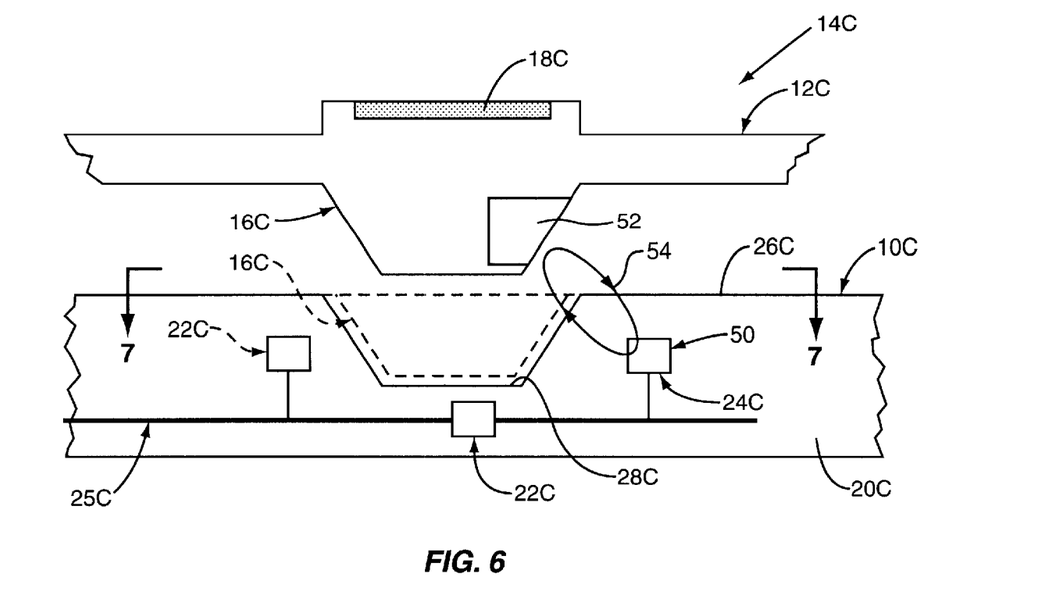
FIG. 6 is a diagrammatic view of another electrical assembly embodying the invention.
Figure 7:
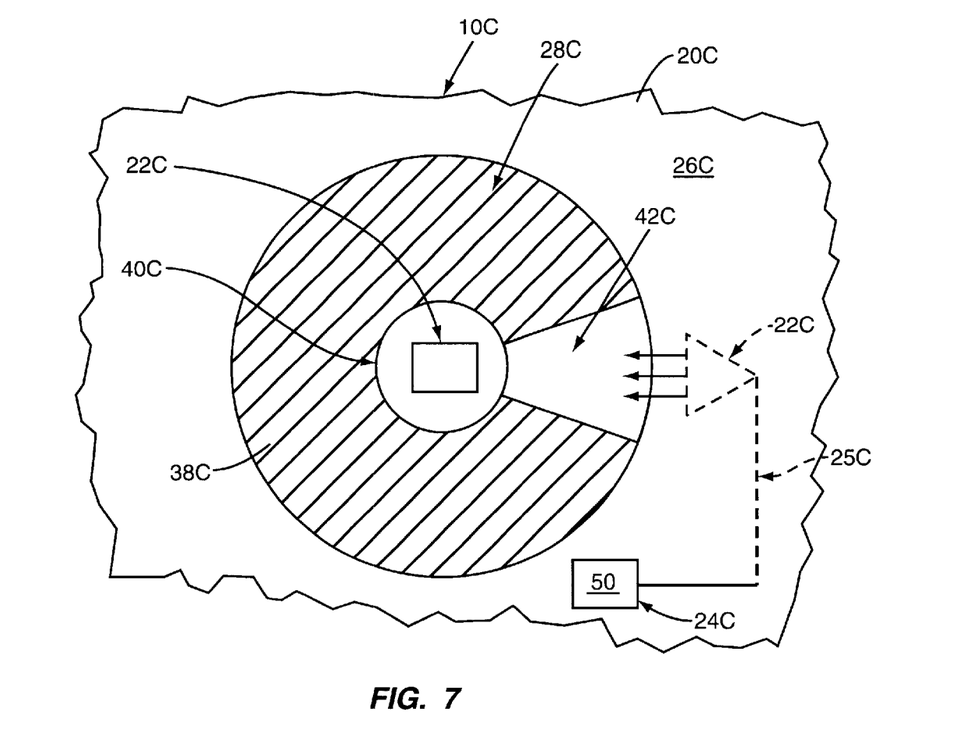
FIG. 7 is a plan view taken along line 7—7 in FIG. 6.

FIG. 6 shows an embodiment of an electrical assembly 10C wherein a switch 24C is provided in the form of a magnetic Hall effect or reed switch 50 embedded in a light guide 20C adjacent a keysite 28C. A plunger 16C includes a magnetic material or coating 52 that will produce a changing magnetic field 54 through the Hall effect/reed switch 50 when the plunger 16C moves between the first and second positions. The Hall effect/reed switch 50 changes between the first and second electrical states in response to the changing magnetic field 54 produced by movement of the plunger 16C between the first and second positions to indicate operation of the key 18C by a user. The Hall effect/reed switch 50 can be positioned at any location on or within the light guide 20C, including underlying the keysite 28C or to one side of the keysite 28C, where the magnetic field 54 can reliably change the switch 50 between the first and second electrical states. The provision and positioning of a light source 22C is the same in this embodiment as for the embodiments shown in FIGS. 2–5. As seen in FIG. 7, if the light source 22C is embedded in the light guide 20C underlying the keysite 28C, there is no need to provide an optically translucent area 42C. Similarly, if the light source 22C is provided to the side of the keysite 28C (as shown in phantom), there is no need for the optically translucent area 40C.

Figure 8:
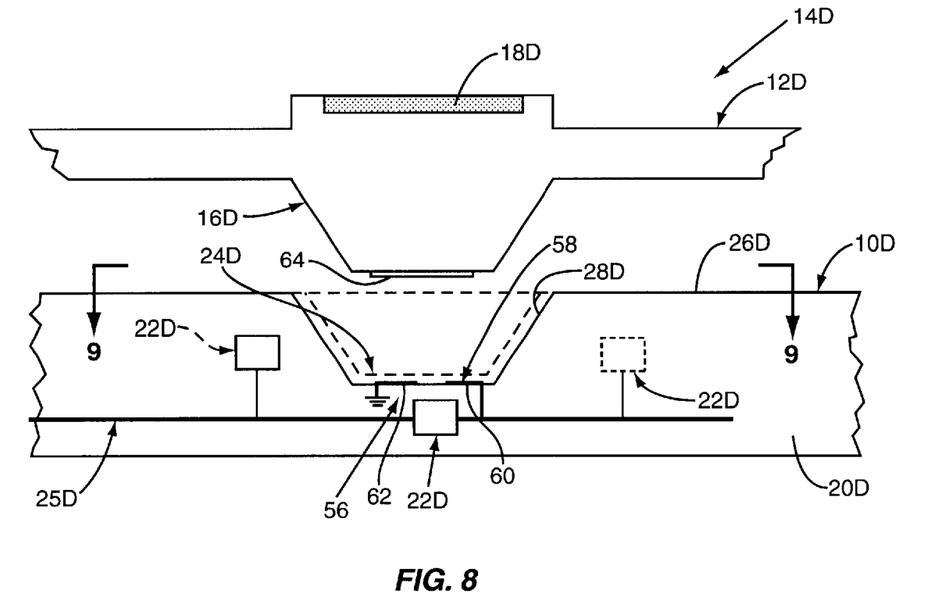
FIG. 8 is a diagrammatic view of another electrical assembly embodying the invention.
Figure 9:
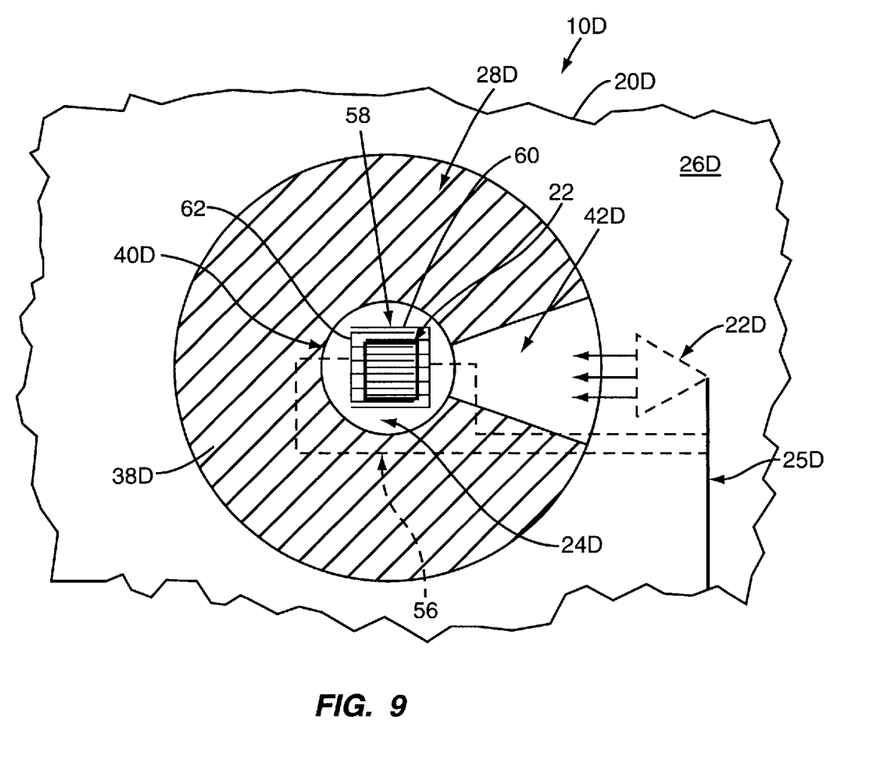
FIGS. 9 and 10 are plan views taken along line 9—9 in FIG. 8.
Figure 10:
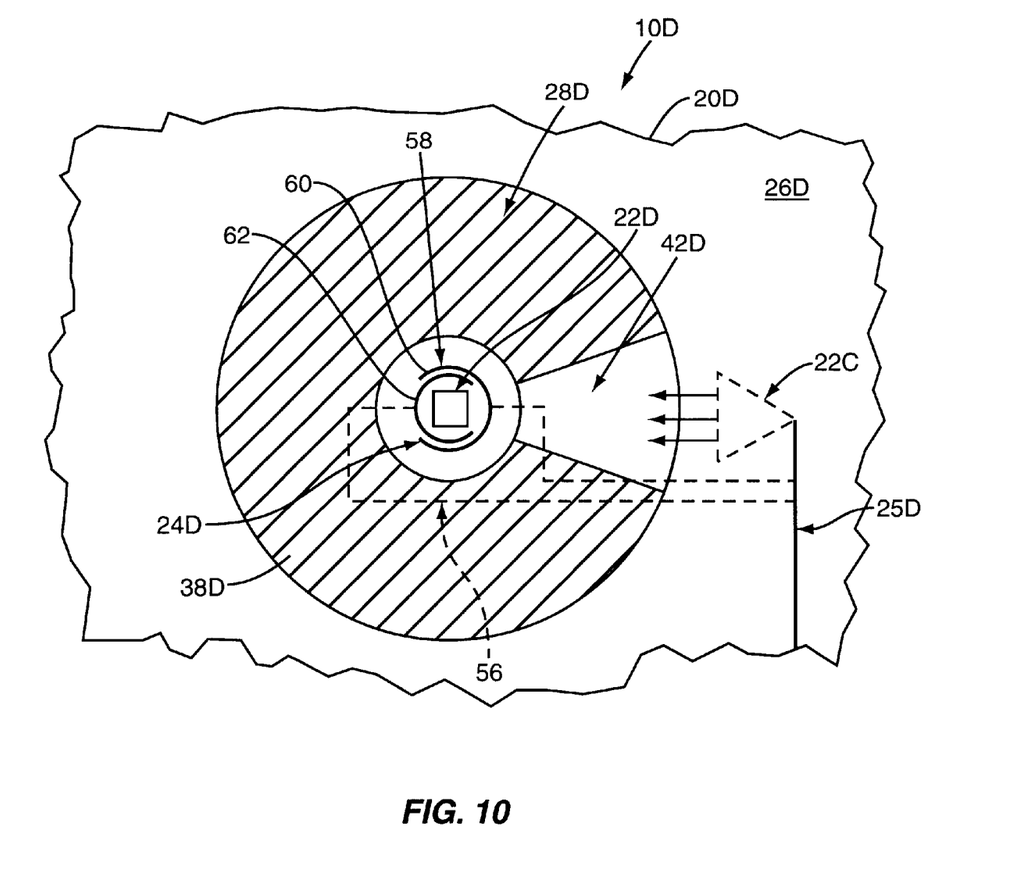

FIGS. 8, 9 and 10 illustrate an embodiment of an electrical assembly 10D wherein a switch 24D is provided in the form of an open electrical circuit 56 defined, in part, by a conductive grid 58 located on a surface 26D of a light guide 20D, preferably at the center of a keysite 28D. The grid 58 includes conductive elements 60 which define one side of the open circuit 56, and conductive elements 62 which define the other side of the open electrical circuit 56. Another conductive grid or plate 64 is carried on a plunger 16D so that it will simultaneously contact the elements 60, 62 to close the electrical circuit 56 when the plunger 16D is in the second position. As seen in FIGS. 9 and 10, it is preferred that a light source 22D be embedded in the light guide 20D underlying the conductive grid 58 to direct light through the conductive grid 58, the keysite 28D, and the plunger 16D to illuminate a key 18D. In this regard, the elements 60, 62 of the grid 58 are of a relatively fine pitch so as to minimize their interference with the light from the light source 22D, as seen in FIG. 9. Alternatively, the elements 60, 62 of the grid 58 can be shaped so as to minimize their interference with the light from the light source 22D, as seen in FIG. 10. If the light source 22D is embedded in the light guide 20D underlying the conductive grid 58, the light reflective material or coating 38D can be provided on the translucent area 42D to enhance the illumination of the key 18D.

It should be understood that any of the light sources that are well-known in the art, such as lamps and light-emitting diodes, may be utilized for the light sources 22(A–D) and 30(A, B). Similarly, any suitable Hall effect or reed switch device may be utilized for the Hall effect/reed switch 50.

Figure 11:
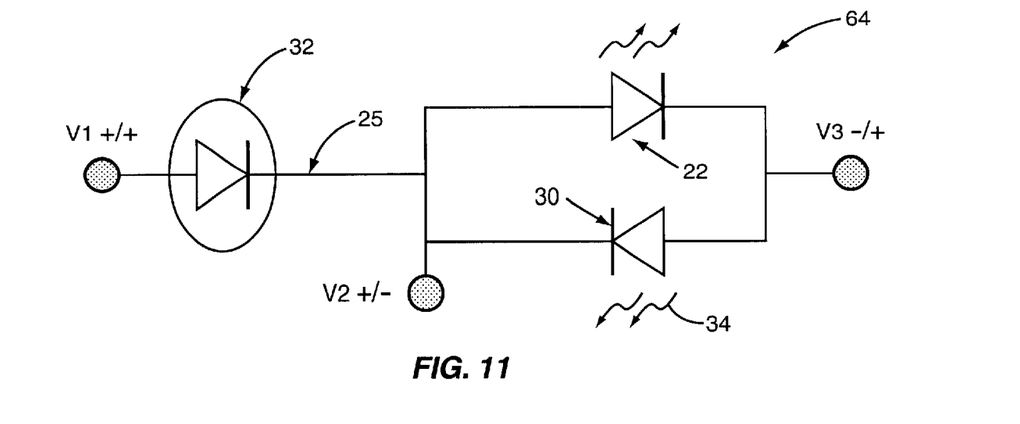
FIG. 11 is a schematic representation of a circuit employed in the electrical assemblies of FIGS. 2–5.
Figure 13:
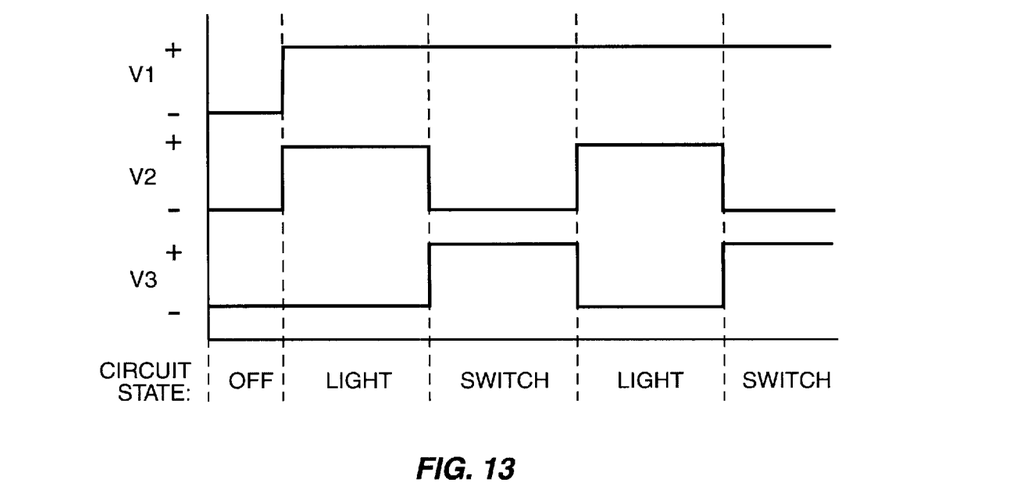
FIG. 13 is a diagrammatic representation of a control scheme for some of the electrical assemblies.

FIGS. 11 and 13 illustrate an electrical circuit 64 and control scheme, respectively, that can be used in connection with the embodiments shown in FIGS. 1–5 to achieve the switching and lighting functions with a minimal amount of circuitry by alternating the polarity at voltage supply points V1, V2, and V3 as shown in FIG. 13. As seen in FIGS. 11 and 13, in an Offmode, V1, V2 and V3 are all the same polarity, V–, which typically will be ground. Accordingly, in the Off mode the light sources 22(A, B), 30(A, B) and the optical detector 32(A, B) are all disabled. In a Light mode, V3 is maintained at the V– or ground polarity, while V1 and V2 are switched to the V+ polarity, which will typically be VCC logic. Accordingly, in the Light mode, the light source 22(A, D) is enabled, while the light source 30(A, B) and the optical detector 32(A, B) remain disabled. In a Switch mode, V2 is switched to the V– or ground polarity, while V3 and V1 are switched to the V+ or VCC polarity. Accordingly, in the Switch mode, the light source 22(A, B) is disabled, while the light source 30(A, B) and the optical detector 32(A, B) are enabled. Preferably, the primary operating mode of the circuit 64 would be in the Switch mode. However, when illumination of the keypad 12(A, B) is desired, the polarity of V2 and V3 would be alternately switched in a complementary pattern as shown in FIG. 13, with the switching rate at a frequency sufficiently great to properly scan the switch 24(A, B) for all operations of the key 18(A, B) by a user and to provide proper illumination without any detectable fading or pulsing of light visible to the user.

Figure 12:
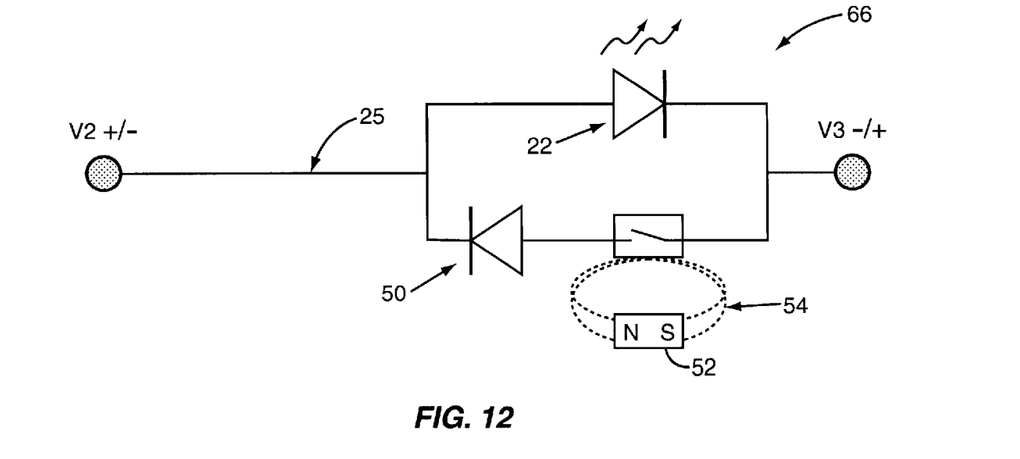
FIG. 12 is a schematic representation of a circuit used in the electrical assembly of FIGS. 6 and 7.

FIG. 12 shows an electrical circuit 66 for use with the electrical assembly 10C shown in FIGS. 6 and 7. The switching pattern shown in FIG. 13 is valid for the circuit of FIG. 11, with V1 being removed. Again, it is preferred for the primary operating mode to be the Switch mode. As with the circuit 64, when illumination of the keypad 12C is desired, the switching rate of the polarity of V2 and V3 would be at a frequency sufficiently great to properly scan the switch 50 for all operations of the key 18C by a user and to provide proper illumination without any detectable fading or pulsing of light visible to the user.

Figure 14:
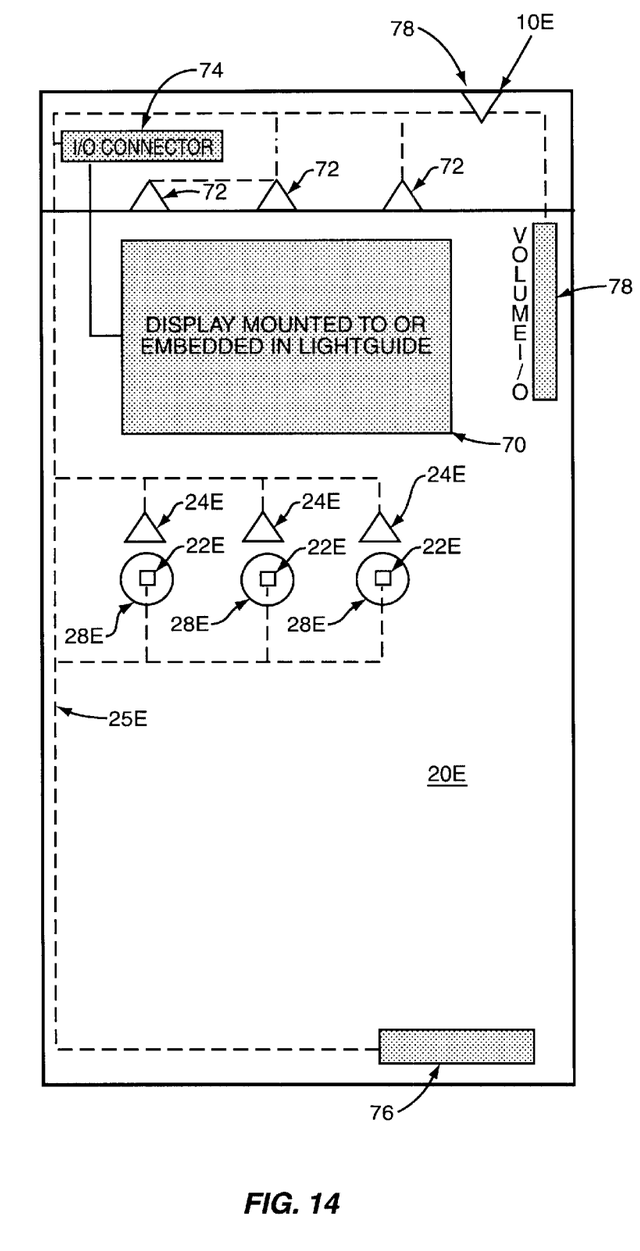
FIG. 14 is a diagrammatic plan view of another electrical assembly embodying the invention.
Figure 15:
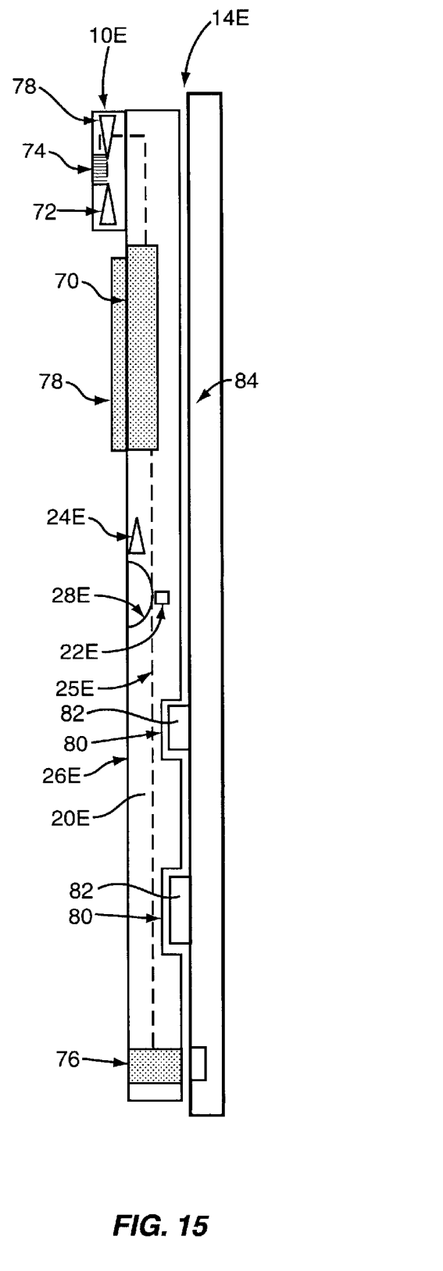
FIG. 15 is a side elevation view of the electrical assembly shown in FIG. 14.

FIGS. 14 and 15 illustrate an electrical assembly 10E employing a plurality of switches 24E and light sources 22E for use with a keypad 12E having a plurality of keys 18E and plungers 16E. Additionally, the electrical assembly 10E includes a display unit 70 mounted in a surface 26E of a light guide 20E; a plurality of light sources 72 for illuminating the display unit 70; a pair of input/output connectors 74 and 76 for connecting the electrical assembly 10E to the remainder of an electronic device 14E; a plurality of other components 78, such as a volume control, an infrared interface, and/or a status indicator light; and an electrical bus 25E for connecting the components 22E, 24E, 25E, 70, 72, 74, 76, 78 to each other and to other component(s) of the electronic device 10, such as circuits or components 82 and PCB 84. As seen in FIG. 14, it is preferred that the components 22E, 24E, 25E, 70, 74, 76, 78 be at least partially embedded in the material of the light guide 20E for a one-piece design. Additionally, as seen in FIG. 15, reliefs 80 can be cut into the light guide 20E to accommodate other circuits or components 82 mounted on a PCB 84 that is mated with the electrical assembly 10E.

It should be appreciated that by combining the keypad illumination and switching functions into one device that can be mounted on a PCB, the electrical assembly 10(A–E) can be constructed to minimize the area on the PCB dedicated to those functions. Additionally, because the electrical assembly 10(A–E) allows for the optimum positioning of the switches 24(A–E) and light sources 22(A–E), the electrical assembly 10 may provide improved keypad illumination and switching functions without increasing PCB area requirements. In this regard, it should be understood that by mounting the switches 24(A–E) on the light guide 20(A–E), rather than on the PCB, the electrical assembly 10(A–E) allows for the light source 22 (A–E) to underlie the keysite 28(A–E), plunger 16(A–E), and key 18(A–E), which is one optimum position for illuminating the key 18(A–E).

What is claimed is:

1. An electrical assembly for use with a keypad for an electronic device, the keypad including at least one plunger associated with a key, the plunger movable between a first position and a second position relative to the electrical assembly in response to operation of the key by a user, the electrical assembly comprising:
    a light guide; and
    at least one electrical component carried by the light guide and positioned to underlie the key for at least one of a) illuminating the key, and b) changing between a first electrical state and a second electrical state in response to the plunger moving between the first and second positions to indicate that the key has been operated by a user.

2. The electrical assembly of claim 1 wherein:
    the light guide has a first surface defining a keysite positioned to underlie the key; and
    the at least one electrical component comprises at least one light source carried in the light guide underlying the keysite to direct light through the keysite to illuminate the key.

3. The electrical assembly of claim 1 wherein the at least one electrical component comprises an open electrical circuit defined by a first conductive grid, the circuit being closed by contact with a conductor grid on the plunger with the plunger in one of the first and second positions.

4. The electrical assembly of claim 3 wherein:
    the light guide has a first surface defining a keysite positioned to underlie the key;

the first conductive grid is mounted on the first surface at the keysite; and the at least one electrical component further comprises at least one light source carried in the light guide beneath the keysite to direct light through the keysite and the conductive grid to illuminate the key.

5. The electrical assembly of claim 4 further comprising a bus carried by the light guide for electrically connecting the circuit and the light source to at least one other component on the electronic device.

6. The electrical assembly of claim 1 wherein the electrical component is embedded in the light guide.

7. An electrical assembly for use with a keypad for an electronic device, the keypad including at least one plunger associated with a key, the plunger movable between a first position and a second position relative to the electrical assembly in response to operation of the key by a user, the electrical assembly comprising:

a light guide;

a switch carried by the light guide, the switch configured to change between a first electrical state and a second state electrical state in response to the plunger moving between the first and second positions to indicate that the key has been operated by a user; and a bus carried by the light guide for electrically connecting the switch to at least one other component of the electronic device.

8. The electrical assembly of claim 7 further comprising a light source carried by the light guide for illuminating at least a portion of the keypad.

9. The electrical assembly of claim 8 wherein the bus carried by the light guide electrically connects the switch and the light source to at least one other component of the electronic device.

10. The electrical assembly of claim 7 wherein the switch is embedded in the light guide.

11. The electrical assembly of claim 7 wherein the switch comprises a light source and an optical detector, the light source and the optical detector positioned by the light guide so that movement of the plunger between the first and second positions interrupts a light signal transmitted to the optical detector from the light source.

12. The electrical assembly of claim 7 wherein the switch comprises a light source and an optical detector, the light source and the optical detector located in the light guide so that movement of the plunger between the first and second positions causes a light signal from the light source to be directed to the optical detector.

13. The electrical assembly of claim 7 wherein the switch comprises a magnetic switch that is responsive to a changing magnetic field produced by movement of the plunger between the first and second positions.

14. The electrical assembly of claim 7 wherein the switch comprises a conductive grid on the light guide that is contacted by a conductor on the plunger with the plunger in one of the first and second positions.

15. A method of illuminating a keypad of an electronic device and detecting operation of a key on the keypad by a user, the method comprising the steps of:

providing a light guide relative to which the key is movable between first and second positions;

generating light in the light guide of the electronic device at a location underlying the key;

transmitting the light to the keypad through the light guide to illuminate the key; and generating a changed electrical state for the electronic device from a location in the light guide in response to operation of the key by a user.

16. The method of claim 15 wherein the step of generating a changed electrical state includes the step of altering a light signal in the light guide to change the electrical state for the electronic device.

17. The method of claim 15 wherein the step of generating a changed electrical state includes the step of altering an electromagnetic field in the light guide to change the electrical state for the electronic device.

* * * * *